United States Patent [19]
Huang
[11] Patent Number: 4,524,125
[45] Date of Patent: Jun. 18, 1985

[54] CHEMICAL ETCHING OF LITHOGRAPHIC ALUMINUM SUBSTRATE

[75] Inventor: Jen-chi Huang, Ossining, N.Y.
[73] Assignee: Polychrome Corporation, Yonkers, N.Y.

[21] Appl. No.: 407,978
[22] Filed: Aug. 13, 1982
[51] Int. Cl.$^3$ .................. G03F 7/02
[52] U.S. Cl. .................. 430/302; 430/278; 101/459; 101/463.1; 204/33; 156/665
[58] Field of Search .................. 430/302; 101/459, 463.1; 204/33, 129.75, 129.8; 156/665

[56] References Cited

U.S. PATENT DOCUMENTS 3,188,211 6/1965 Kocsuta .................. 430/323
3,220,899 11/1965 Leonard .................. 156/23
4,116,695 9/1978 Mori et al. .................. 430/164
4,201,836 5/1980 Huang .................. 428/457
4,229,266 10/1980 Usbeck .................. 204/33
4,242,417 12/1980 Huang .................. 428/457
4,377,447 3/1983 Bednarz .................. 204/15
4,388,159 6/1983 Dockus et al. .................. 204/33
4,420,549 12/1983 Cadwell .................. 430/158
4,477,317 10/1984 Chu et al. .................. 204/33
4,497,888 2/1985 Nishioka et al. .................. 430/165

*Primary Examiner*—John E. Kittle
*Assistant Examiner*—José G. Dees

[57] ABSTRACT

The method of production of lithographic aluminum substrates which comprises first mechanically graining a surface of an aluminum sheet to obtain a pumice grained surface and then etching with a hot sulfuric acid (10–90%) solution.

3 Claims, No Drawings

CHEMICAL ETCHING OF LITHOGRAPHIC ALUMINUM SUBSTRATE

BACKGROUND OF THE INVENTION

The present invention relates to the treatment of lithographic grade aluminum webs and other substrates for use in the production of printing plates. The aluminum web is coated with a light-sensitive compound or composition by conventional methods using conventional coatings to obtain the finished lithographic plate.

Lithographic plates which have a coating of a light-sensitive material adherent to an aluminum base sheet are well known. When the light-sensitive composition is applied by the manufacturer, the plate is referred to as a "presensitized plate". If the light-sensitive material is applied to the base by the lithographer or trade plate maker, the plate is referred to as a "wipe-on" plate. Depending on the nature of the photosensitive coating employed, the treated plate can be utilized to produce the image to which it is not exposed directly, in which case it is termed a positive acting plate, or to produce an image which is complementary to the one to which it is exposed, in which case it is termed a negative acting plate. In either case, the image area of the developed plate is oleophilic and the non-image area is hydrophilic.

In coating a metallic plate with the light-sensitive material, it is highly desirable initially to provide the metal with a hydrophilic surface to which the light-sensitive coating adheres and which becomes the ink repulsive non-image area upon removal of the unconverted or unhardened light-sensitive material. Many methods of producing such hydrophilic surfaces on metallic plates for planographic printing purposes are known and are described, for example, in U.S. Pat. No. 3,891,516 to Chu, which is hereby incorporated by reference.

Lithographic plates have been grained in a variety of ways, including mechanically by rubbing with an abrasive, by sandblasting and by wire brushing, and chemically by treatment with various materials. If desired, according to Chu, the plate can thereafter be mildly etched in a warm alkaline solution and rinsed.

Anodized photographic and lithographic plates, particularly aluminum plates, are known and commercially available. In general, such plates are made by pumice slurry graining, chemically etching aluminum, or electrolytic etching of a clean aluminum sheet with alternating current, usually in a hydrochloric or nitric acid solution, to grain or etch the surface. Chu found that superior results could be achieved by pre-graining the aluminum base sheet with a wet mass of fine, hard, abrasive particles, preferably pumice, followed by direct current anodization in an acid, preferably sulfuric acid, electrolytic solution. The conventional way for anodizing an aluminum web involves connecting the anodic terminal for the DC current to a metallic roller which supports the aluminum web before it enters the electrolyte. When the DC current passes through the electrolysis tank, the aluminum is anodized and an oxide layer, the so-called anodic oxide, forms on its surface.

The thin cover layer of aluminum oxide formed on the aluminum sheet following etching and anodization is usually filled with a so-called sealing chemical and then coated with a light-sensitive material.

When employed, the common lithographic plate etching or whitening steps today utilize alkali-type etchings, phosphoric acids and acid fluorides. Each of these systems has its individual advantages and disadvantages involving process control, etching speed, etching latitude and general process efficiencies. In general, it has been found that too little etching results in a residue of imbedded pumice on the topographic surface, reduces shelf life and reduces the latitude of developability. On the other hand, over etching leads to undesirable grain directionality as well as a reduction in press life.

It is the object of this invention to provide a new lithographic plate etching or whitening procedure which provides advantages with regard to process control etching speed, etching latitude, efficiency and which minimizes the number of waste products and compositions which must be environmentally treated under government regulations which have become more complicated and more strict over the past several years.

This and other objects of the invention will become apparent to those skilled in the art from the following detailed description.

SUMMARY OF THE INVENTION

In accordance with the present invention, it has been found that if a chemical etching step utilizing hot sulfuric acid is carried out intermediate of the mechanical graining and the anodization treatments, superior lithographic plates are provided. The use of sulfuric acid in the processing steps provides the further environmental advantage of being able to recycle the sulfuric acid from the various stages utilizing commercially available decontamination units such as those sold by Eco-Tech under the trademarks "APU" and "DPU" and the like. The ability to use a single acid in the pretreatment of the aluminum metal web and in the subsequent anodization constitutes, as will be appreciated by those skilled in the art, an important commercial advantage.

DESCRIPTION OF THE INVENTION

The term "lithographic grade aluminum web(s)" as used in this specification and claims is intended to encompass aluminum webs, coils and sheets which are useful for, and manufactured expressly for, the production of lithographic printing plates. Among such webs which have been found to be very suitable for this purpose are the Aluminum Association Alloys such as 1100, 3003 and 1050.

Before the etching procedure, the lithographic grade aluminum web is grained. The web is first degreased in the conventional fashion and it is advantageous to use a sulfuric acid based degreasing agent so as to minimize the number of distinct chemicals which are used in the process. Any of the known graining procedures can then be employed and it is preferred to use the web graining mass of fine abrasive particles of pumice taught in the aforementioned Chu patent. The grained aluminum web is then treated with the hot sulfuric acid before it is anodized.

The grained lithographic grade aluminum web is subjected to hot sulfuric acid at a temperature of about 70°-100° C., preferably about 85°-90° C. to carry out the chemical etching or whitening step before anodization. The concentration of the sulfuric acid is about 30-90%, preferably about 30-70% and the length of the contact time is generally about 0.5-5 minutes, preferably about 1-2 minutes. The concentration of the sulfuric acid can be reduced to about 10-30%, preferably about 15-25% and the contact time to about 0.25-2 minutes, preferably 0.5-1 minute by the additional use of an AC current. In this case, the AC current density is preferably at least 7A/dm$^2$ although lower current densities can be used, depending on the sulfuric acid concentration, temperature and contact time. In this case, graphite electrodes are immersed in the hot sulfuric acid solution in appropriate proximity to the aluminum web as it passes through that solution. The graphite electrode did not disintegrate in hot sulfuric acid when AC current was applied.

If desired, the hot sulfuric acid solution can contain additives for increasing the etching rate and roughness. Suitable additives include hydrochloric acid, alkali metal halides such as sodium fluoride and sodium chloride and aluminum chloride. Additionally, ammonium sulfate can be used for ammonium alum precipitation which results in situ regulation of the aluminum content in the sulfuric acid solution. Such additives can be used in any amount which will not adversely interfere with the subsequent anodization. Some quantity of the additive will be carried by the web into the anodizing bath from the hot sulfuric acid etching bath, and the amount of "drag-in" of the additive must be maintained within acceptable limits. For example, the amount of drag-in of sodium fluoride should be maintained below about 0.1% in order to maintain an acceptable shelf life of the treated plate and a sufficient amount of anodic oxide. For example, measurement of the weight of anodic oxide as a result of the anodization of pumice grained aluminum in 20% $H_2SO_4$ at 27° C. and 35 amp.×min./square foot showed the amount of anodic oxide was 2.68, 2.53 and 2.52 g/m$^2$ when the sodium fluoride concentration was 0, 0.01 and 0.1%, respectively. However, when the amount of sodium fluoride was 1%, the weight of the anodic oxide was 1.09 g/m$^2$. In order to minimize the drag-in, the treated aluminum web can be washed, for example with water, before it is introduced into the anodization bath.

Following treatment with the hot sulfuric acid, the grained and etched lithographic grade aluminum webs are anodized. The webs are used as the anodes in an anodizing tank in which sulfuric acid at a concentration of about 2-30%, preferably about 15%, is the preferred electrolytic medium. The temperature is usually at or slightly higher than ordinary room temperature and the DC voltage is usually about 10-60 volts. A current density of about 10-200 amperes per square foot, preferably about 15 amperes per square foot, is used. The anodized web is thereafter coated with a light-sensitive composition in the conventional fashion.

EXAMPLE I

Shelf life and press run evaluations were performed for a negative acting coating on a pumice grained, hot sulfuric acid etched, anodized aluminum substrate. The results are shown in the following Table 1 and all of the hot sulfuric acid treated substrates had a shelf life which was equivalent to the control in which the hot sulfuric acid etch step had been omitted.

TABLE 1

| Sulfuric Acid Concentration | Etching Conditions | Optical Density* | Press Run Copies (% of Control) |
|---|---|---|---|
| 70% | 78° C.; 45 sec. | 0.35 | 12,500 (+25%) |
| 70% | 76° C.; 60 sec. | 0.28 | 12,500 (+25%) |
| — | Control | 0.50 | 10,000 |

*After Anodizing

EXAMPLE II

Similar tests were performed additionally employing an AC current and the results are shown in Table 2.

TABLE 2

| Sulfuric Acid Concentration | Etching Conditions (AC) | Optical Density* | Press Run Copies (% of Control) |
|---|---|---|---|
| 20% | 90° C.; 5.6 A/dm$^2$; 60 sec. | 0.30 | 17,500 (0%) |
| 20% | 90° C.; 6.0 A/dm$^2$; 60 sec. | 0.31 | 20,000 (+14%) |
| — | Control | 0.65 | 17,500 |

*After Anodizing

EXAMPLE III

Three 8 mil. thick pumice grained aluminum coils were prepared. One coil was chemically etched in 20% $H_2SO_4$ at 90° C. for 60 seconds, and the second coil was chemically etched in a solution containing 20% $H_2SO_4$ plus 2% NaF at 90° C. for 48 seconds. The third coil was grained only. The three coils were then anodized and coated with a positive acting light-sensitive composition and subjected to a press test. The control plate, i.e. the plate which was not treated with the hot sulfuric acid, had a length of run of 48,000 impressions. The plate which had been treated with the hot sulfuric acid containing sodium fluoride had a length of run of 98,000 impressions (i.e. +104% of the control) and the plate which had been treated with the hot sulfuric acid without the sodium fluoride had a length of run of 130,000 impressions (i.e. +170% of the control).

Various changes and modifications can be made in the process and products of this invention without departing from the spirit and scope thereof. The various embodiments which have been set forth herein were for the purpose of further illustrating the invention but were not intended to limit it.

What is claimed is:

1. A non-electrolytic etching method for preparing a lithographic grade aluminum web which comprises intially contacting a grained lithographic grade aluminum web, said aluminum web being grained with a mass of fine abrasive pumice particles, with a solution consisting of hot sulfuric acid at a temperature of about 70°-100° C., having a sulfuric acid concentration of about 10-90%, and wherein the resulting hot sulfuric acid treated web is anodized directly after the non-electrolytic etching treatment.

2. The method of claim 1 wherein the hot sulfuric acid is at a temperature of about 85°-90° C.

3. The method of claim 2 wherein the sulfuric acid concentration is about 30-90%.

* * * * *